United States Patent [19]
Baum et al.

[11] Patent Number: 6,017,613
[45] Date of Patent: Jan. 25, 2000

[54] METHOD FOR PHOTOSELECTIVE SEEDING AND METALLIZATION OF THREE-DIMENSIONAL MATERIALS

[75] Inventors: Thomas H. Baum, New Fairfield, Conn.; Luis J. Matienzo, Endicott, N.Y.; Cindy Reidsema Simpson, Austin, Tex.; Joseph E. Varsik, Binghamton, N.Y.

[73] Assignee: International Business Machines Corporation, Armonk, N.Y.

[21] Appl. No.: 08/736,889

[22] Filed: Oct. 25, 1996

Related U.S. Application Data

[60] Division of application No. 08/684,280, Jul. 17, 1996, which is a continuation-in-part of application No. 08/254,340, Jun. 6, 1994.

[51] Int. Cl.[7] .................................................. B32B 9/00
[52] U.S. Cl. ..................... 428/209; 430/311; 430/315; 430/417; 156/656; 428/901; 439/55
[58] Field of Search .................... 430/377, 551, 430/567, 601, 611, 417, 275, 275.1, 315, 314, 496; 156/656; 428/209, 901; 439/55

[56] References Cited

U.S. PATENT DOCUMENTS

| | | | |
|---|---|---|---|
| 4,006,047 | 2/1977 | Brummett et al. | 427/98 |
| 4,618,568 | 10/1986 | Gemmler | 430/311 |
| 4,757,035 | 7/1988 | Baney et al. | 501/88 |
| 4,981,715 | 1/1991 | Hirsch et al. | 427/53.1 |
| 5,057,402 | 10/1991 | Shiba et al. | 430/377 |
| 5,302,854 | 4/1994 | Nishiguchi et al. | 257/737 |
| 5,529,829 | 6/1996 | Koskenmaki et al. | 428/209 |

OTHER PUBLICATIONS

IBM Technical Disclosure Bulletin, vol. 33 No. 6B Nov. 1990. by T.H. Baum.
Photoselective Catalysis of Electroless Copper Solution for the Formation of Adherent Copper Films into Polyimide by T.H. Baum, May, 1991.

*Primary Examiner*—Deborah Jones
*Assistant Examiner*—Cathy F. Lam
*Attorney, Agent, or Firm*—William N. Hogg

[57] ABSTRACT

A method is provided for selectively metallizing one or more three-dimensional materials in an electronic circuit package comprising the steps of forming a layer of seeding solution on a surface of the three-dimensional material of interest, exposing this layer to light of appropriate wavelength, resulting in the formation of metal seed on regions of the three-dimensional material corresponding to the regions of the layer of seeding solution exposed to light; removing the unexposed regions of the layer of seeding solution by subjecting the exposed and unexposed regions of the layer of seeding solution to an alkaline solution. Thereafter, additional metal is deposited, e.g., plated, onto the metal seed using conventional techniques. Significantly, this method does not involve the use of a photoresist, or of a corresponding chemical developer or photoresist stripper. Of additional significance, this method is ideal for plating three-dimensional materials such as cone-shaped connectors used in electronic circuit packages.

13 Claims, 1 Drawing Sheet

6,017,613

METHOD FOR PHOTOSELECTIVE SEEDING AND METALLIZATION OF THREE-DIMENSIONAL MATERIALS

This application is a division of application Ser. No. 08/684,280, filed Jul. 17, 1996, which is a continuation in part of Method for Selectively Metallizing a Substrate filed as U.S. Ser. No. 08/254340 filed Jun. 6, 1994 and now on appeal before the Board of Patent Appeals and Interferences.

BACKGROUND OF THE INVENTION

1. Field of the Invention

The invention pertains to a method for selectively metallizing, e.g., forming an electrical circuit on, a three-dimensional surface such as a cone connector used in a multilayer circuit board, which method does not require the use of a photoresist.

2. Description of the Related Art

A substrate, such as a printed circuit board substrate, is conventionally selectively metallized, e.g., an electrical circuit is formed on the substrate, by initially forming a patterned seeding layer of, for example, palladium (Pd) on a surface of the substrate. The resulting substrate is then immersed in a metal plating bath, such as an electroless copper plating bath, where the corresponding metal, e.g., copper, is selectively deposited from solution just onto the patterned seeding layer. The selectively deposited copper then constitutes the desired selective metallization, e.g., the desired electrical circuit.

When forming the patterned seeding layer, either a subtractive or an additive procedure is used. In the subtractive procedure, an unpatterned seeding layer of, for example, palladium is initially formed on the substrate surface of interest. This is achieved by, for example, sputtering the seed metal onto the substrate surface. Alternatively, the seed metal is deposited from solution. For example, an unpatterned layer of palladium is readily deposited onto the substrate surface from a solution containing a palladium salt and tin chloride. Once the seed metal is deposited, a layer of photoresist is deposited on the seeding layer, exposed through a mask bearing the pattern of interest and developed. The underlying seeding layer is then etched, e.g., chemically etched, while using the patterned photoresist as an etch mask. Thereafter, the photoresist is chemically stripped, leaving just the patterned seeding layer.

In the additive procedure, a layer of photoresist is initially deposited onto the substrate surface of interest, exposed through a mask and developed. A metal seed, such as palladium, is then deposited onto the substrate surface of interest, while using the patterned photoresist layer as a deposition mask. The patterned photoresist layer (as well as the metal seed deposited onto the photoresist, per se) is then chemically stripped, leaving just the metal seed deposited into the openings in the patterned photoresist layer, which constitutes the patterned seeding layer.

As is known, the use of photoresists. and the corresponding chemical developers and strippers is environmentally undesirable. Consequently, attempts have been made to develop methods for forming patterned seeding layers which do not rely on the use of photoresists. Moreover, the foregoing methods do not work well for three-dimensional polymeric materials (that is, materials in a shape other than a flat surface).

One method for forming a patterned seeding layer which does not rely on the use of a photoresist is described by Thomas H. Baum et al in "Photoselective Catalysis of Electroless Copper Solutions for the Formation of Adherent Copper Films onto Polyimide," Chem. Mater., Vol. 3, No. 4, 1991, pp. 714–720. According to this journal article, a patterned seeding layer of palladium is formed on a surface of a polyimide substrate by immersing the substrate surface in an aqueous seeding solution. This solution includes hydrated forms of potassium trioxalatoferrate ($K_3Fe(C_2O_4)_3$) and tetraamine palladium chloride ($Pd(NH_3)_4Cl_2$). The resulting layer of seeding solution on the substrate surface is then irradiated with UV light through a mask, to photoselectively deposit palladium metal from the UV-irradiated regions of the solution onto the substrate surface. As a result, a patterned palladium seeding layer is formed without the use of a photoresist. (This patterned seeding layer remains in contact with, and surrounded by, the unexposed regions of the layer of seeding solution.)

According to the Baum et al journal article, immersing a polyimide substrate bearing a patterned palladium seeding layer, produced as described above, in an electroless copper plating bath having a pH of 12 results in deposition of copper just onto the palladium. However, as discussed below, it has been found by the present inventors that subsequent immersion of a second, third, fourth, etc., such polyimide substrate into the same electroless copper plating bath quickly results in serious difficulties. Moreover, these very same difficulties arise when the above-described method of photoselective palladium deposition is applied to other organic substrates, such as the epoxy resin/fiberglass substrates and fluoropolymer-containing substrates used in printed circuit board manufacture. Further, these same difficulties arise when the above-described method of photoselective palladium deposition is applied to inorganic, ceramic substrates, such as alumina substrates, aluminum nitride substrates and silicon nitride substrates.

SUMMARY OF THE INVENTION

The invention involves the finding by the present inventors that when a patterned seeding layer, e.g., a patterned palladium seeding layer, is formed on a three-dimensional substrate, such as a polyimide substrate, a printed circuit board substrate or a ceramic substrate, using the method described in the Baum et al journal article, and the substrate is then immersed in a metal plating bath, e.g., an electroless copper plating bath, to form a corresponding electrical circuit, that metal is often deposited not just onto the patterned seeding layer. Rather, metal is also deposited on the unexposed regions of the photoactive layer of seeding solution remaining on the substrate surface, and the frequency of this unwanted metal deposition increases as the number of such substrates immersed in the same metal plating bath increases. As a consequence, the electrical circuit formed on the surface of such a substrate exhibits undesirable short circuits. Moreover, it has been found that the metal plating bath into which the substrates are immersed becomes poisoned by the unexposed seeding solution and unstable.

The invention also involves the finding that the above-described problems of unwanted metal deposition and bath instability are avoided by removing the unexposed regions of the photoactive layer of seeding solution remaining on the substrate surface, leaving just the patterned seeding layer, before immersing the substrate in a corresponding metal plating bath. This removal is readily achieved by subjecting the exposed and unexposed regions of the photoactive layer of seeding solution to an alkaline solution such as, for example, an aqueous sodium hydroxide solution. During this removal process, essentially no metal is deposited on either the patterned seeding layer or the unexposed regions of the layer of seeding solution.

Significantly, the added step of subjecting the exposed and unexposed regions of the photoactive layer of seeding solution to the above-described alkaline solution achieves an unexpected, advantageous result. That is, if the layer of seeding solution is formed using, for example, potassium trioxalatoferrate and tetraamine palladium chloride, then subjecting the exposed and unexposed regions of the photoactive layer of seeding solution to the above-described alkaline solution not only serves to remove the unexposed regions, but also serves to form an oxidized species of iron, e.g., iron oxyhydroxide (FeOOH), gel around the seed metal, per se. This gel prevents oxidation of the seed metal, and thus permits a substrate bearing a patterned seeding layer to be stored for months before immersion in a metal plating bath. Moreover, this gel quickly expands and becomes very permeable in the metal plating bath when the substrate is immersed in the bath, thereby permitting metal to be readily deposited onto the patterned seeding layer.

The invention further involves the finding that, in addition to patterned palladium seeding layers, patterned seeding layers of, for example, platinum (Pt), gold (Au) and silver (Ag) are also readily photoselectively formed on substrates. All such patterned seeding layers are formed, in accordance with the invention, by exposing appropriate photoactive layers of seeding solution to UV light through a mask, and then removing the unexposed regions of these layers, as described above. Significantly, each such photoactive layer of seeding solution has a composition which includes a metal-containing, water-soluble compound and a photoreactive, water-soluble, oxalate compound.

The present invention is uniquely suited for use in plating three-dimensional polymeric materials such as the three-dimensional cones used as connectors in circuit boards. The close proximity of the cones, fragility of the cones, and the need for selective metallization of the cones makes traditional coating methods inappropriate.

DETAILED DESCRIPTION OF PREFERRED EMBODIMENT(S)

Figure 1:
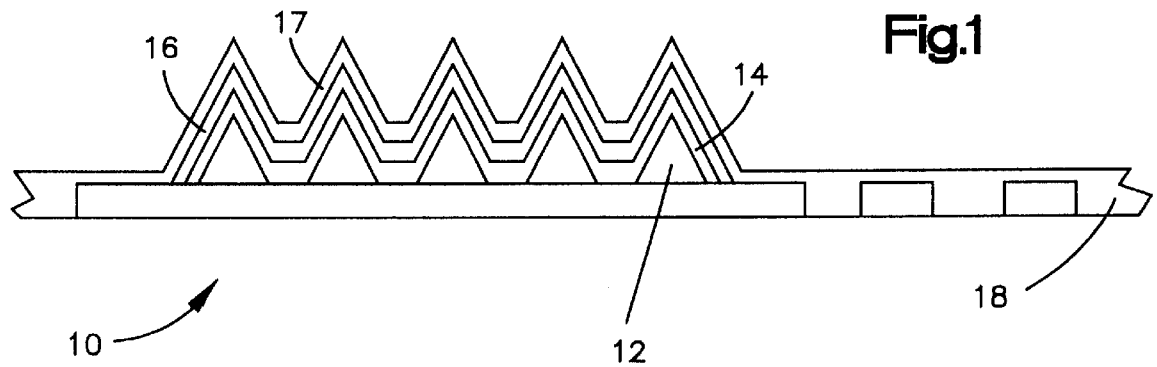
FIG. 1 is a cross-section of three-dimensional cones plated in accordance with the invention.

The invention involves a method for selectively metallizing, e.g., forming an electrical circuit on, a three-dimensional substrate, such as the cones used as connectors in a printed circuit board substrate, a polyimide substrate or a ceramic substrate. Significantly, this method does not require the use of a photoresist or of the corresponding chemicals needed to develop and strip such a photoresist.

The present invention pertains to plating three-dimensional substrates such as the polymers formed into pads containing a matrix of cones that are used as an electrical interconnection in electronic packaging applications such as in integrated circuit chips and circuit boards, cards, cables, and modules. One way of forming the cones is to begin by laminating a 3 mil layer of Vacrel onto copper circuitry. The Vacrel layer is then exposed and developed to form pads on the circuitry, and then laser ablated to form 3 mil high cones. The pads and cones then must be metallized, while leaving the surrounding dielectric material (i.e., polymide or epoxy) free from metal deposits. The present invention provides a method for performing the metallization of the cones or other three-dimensional surfaces.

In the first step of the method, a patterned metal seeding layer is initially formed on the three-dimensional substrate surface of interest, using the photoselective process described below. Here, the patterned metal seeding layer is preferably of palladium (Pd). Alternatively, the patterned metal seeding layer is of platinum (Pt), gold (Au) or silver (Ag).

According to the photoselective process of the present invention, the surfaces of the cones and pads are micro-etched. A bath of seeding solution is then formed, into which the three-dimensional micro-etched substrate is to be dipped. Alternatively, this bath is used as a source of seeding solution which is spray-coated onto the substrate. Significantly, this seeding solution is an aqueous solution, and has a composition which includes a metal-containing, water-soluble compound and a photoreactive, water-soluble, oxalate compound. (For purposes of the present invention, a photoreactive oxalate compound is an oxalate compound which, when impinged by light of appropriate wavelength, undergoes a reaction with the metal-containing compound, during which the metal ion in the metal-containing compound is reduced to the corresponding base metal.)

The metal-containing, water-soluble compound, referred to above, has the general chemical formula $ML_mX_n$, where M denotes a metal cation, L is a nitrogen-containing, Lewis base ligand, X denotes an anion and m and n denote integers. If the patterned seeding layer is to be of palladium (Pd), platinum (Pt), gold (Au) or silver (Ag), then M denotes $Pd^{(2+)}$, $Pt^{(2+)}$, $Au^{(1+)}$, $Au^{(3+)}$ or $Ag^{(+1)}$. (As is conventional, the superscripts used throughout this disclosure denote oxidation states). The Lewis base ligand, L, is a monodentated or polydentated ligand such as, for example, $NH_3$ or ethylenediamine. The anion, X, is, for example, $F^{(-1)}$, $Cl^{(-1)}$, $Br^{(-1)}$, $(SO_4)^{(-1)}$ or $(NO_3)^{(-1)}$. If, for example, M denotes $Pd^{(2+)}$, then $ML_mX_n$ is preferably $Pd((NH_3)_4Cl_2$, which is just tetraamine palladium chloride, more conventionally written $(NH_3)_4PdCl_2$. Of course, hydrated forms of the above-described metal-containing compound, $ML_mX_n$, are also encompassed by the present invention.

The photoreactive, water-soluble, oxalate compound, referred to above, has the general chemical formula $Y_pM((C_2O_4)_3)_p$, where p denotes an integer. Here, Y denotes, for example, an alkali metal ion, such as $K^{(+1)}$ or $Na^{(+1)}$. Alternatively, Y denotes or includes the quaternary ammonium ion, i.e., $(NH_4)^{(+1)}$. In addition, M denotes either the iron ion, i.e., $Fe^{(+3)}$, or the ruthenium ion, i.e., $Ru^{(+3)}$. If the patterned seeding layer is to be of, for example, palladium, then the photoreactive, water-soluble, oxalate compound is preferably potassium iron oxalate (potassium trioxalatoferrate), i.e., $K_3Fe((C_2O_4)_3)$. Hydrated forms of the above-described photoreactive, water-soluble, oxalate compound, $Y_pM((C_2O_4)_3)_p$ are also encompassed by the present invention.

While not essential, the seeding solution bath preferably also includes a surfactant, such as the surfactant sold under the trade name Triton X-100 by the Rohm Haas company of Philadelphia, Pa.

To ensure complete reduction of the metal-containing compound by the photoreactive oxalate compound in a seeding solution bath, the mole ratio of the latter to the former should be at least 8:1, and is preferably 10:1. Keeping this limitation in mind, the concentration of the metal-containing compound in the seeding solution bath ranges from about 4 grams per liter of water (g/L) to about 9.5 g/L, and is preferably about 7 g/L. Concentrations less than about 4 g/L are undesirable because an undesirably small amount of seed metal is deposited onto the corresponding substrates. Concentrations greater than about 9.5 g/L are undesirable because the seeding solution becomes saturated with metal-containing compound at a concentration of about 9.5 g/L, and further additions of such compound are not dissolved in the solution.

The concentration of the photoreactive oxalate compound in the seeding solution bath ranges from about 25 g/L to about 65 g/L, and is preferably about 47 g/L. Concentrations less than about 25 g/L are undesirable because this implies there is insufficient photoreactive material to reduce all the metal in the metal-containing compound. Concentrations greater than about 65 g/L are undesirable because the seeding solution becomes saturated with the oxalate compound at a concentration of about 65 g/L, and further additions of such compound are not dissolved in the solution.

The concentration of the surfactant in the seeding solution bath, if used, ranges from about 0.02 parts per million (ppm) to about 2 ppm, and is preferably about 1 ppm. Concentrations less than about 0.02 ppm are undesirable because they result in poor wetting of the corresponding substrates by the other constituents of the solution. Concentrations greater than about 2 ppm are unnecessary, i.e., they produce no enhanced wetting effect.

When forming the seeding solution bath, the constituents of the bath should be added to the bath container in the following order, to avoid bath instability: (1) add water; (2) add surfactant; (3) add photoreactive oxalate compound, while stirring, until the photoreactive oxalate compound is completely dissolved; and (4) add metal-containing compound, while stirring, until the metal-containing compound is completely dissolved. It should be noted that the above steps should be carried out under, for example, yellow light to avoid decomposition of the photoreactive oxalate compound.

By way of example, if the patterned seeding layer is to be of palladium, and the constituents of the corresponding seeding solution bath include tetraamine palladium chloride, potassium trioxalatoferrate and Triton X-100 surfactant, then a useful (stable) bath is readily. formed by initially pouring, for example, 100 mL of water into the bath container. One should then add, for example, two drops of Triton X-100 surfactant to the bath. Then, one should add, for example, 4.7 grams of potassium trioxalatoferrate hydrate to the bath, while stirring, until the potassium trioxalatoferrate hydrate is completely dissolved in the bath. Finally, one should add, for example, 0.7 grams of tetraamine palladium chloride monohydrate to the bath, while stirring, until the latter is completely dissolved in the bath.

It should be noted that the seeding solution bath is preferably continuously filtered, using conventional filter cartridges, e.g., conventional 5 micrometer filter cartridges, to remove particles from the bath. If the photoreactive oxalate compound dissolved in the bath is, for example, potassium trioxalatoferrate, then these particles are typically iron-containing particles, such as iron oxide particles. It is believed that these particles form in the bath because the oxalate compound is sensitive to light, and the bath is unavoidably exposed to light. These particles are undesirable and are removed to prevent these particles from being deposited onto substrates immersed in the bath. In addition, an excessive concentration of these particles may cause the bath to become unstable.

Once the seeding solution bath is formed, the three-dimensional substrate of interest is immersed in the bath to form a photoactive layer of seeding solution on the substrate surface of interest. The thickness of this layer ranges from about 20 Angstroms to about 60 Angstroms, and is preferably about 40 Angstroms. Thicknesses less than about 20 Angstroms are undesirable because the resulting seed metal coverage is incomplete and the seed metal has an undesirably large number of pinholes. Thicknesses greater than about 60 Angstroms are unnecessary because they provide no advantage.

In the second step of the method, ultraviolet (UV) light, i.e., light having a wavelength ranging from about 200 nanometers (nm) to about 450 nm, and preferably about 300 nm to about 450 nm, is now shined onto the photoactive layer of seeding solution through a mask. A useful source of such UV light is, for example, UV lamp Model 161B sold by the Tamarak Scientific company of Anaheim, California. As discussed above, shining such UV light onto the seeding solution results in a photoinduced reaction in which metal, e.g., palladium, is formed on regions of the substrate surface corresponding to the exposed regions of the photoactive layer of seeding solution. The intensity of the UV light impinged upon the layer of seeding solution ranges from about 20 millijoules per square centimeter ($mJ/cm^2$) to about 180 $mJ/cm^2$, and is preferably about 65 $mJ/cm^2$. Intensities less than about 20 $mJ/cm^2$ are undesirable because less than all of the metal-containing compound reacts with the oxalate compound. Intensities greater than about 180 $mJ/cm^2$ are undesirable because an intermediate product formed during the reaction between the oxalate compound and the metal-containing compound is decomposed, resulting in the formation of an undesirable oxide, e.g., iron oxide, which is deposited onto the corresponding substrate. Significantly, metal, e.g., copper, will not plate onto this oxide.

In connection with the reaction between the metal-containing compound and the oxalate compound, it is believed that the impingement of UV light results in the formation of an oxalate radical, which serves to reduce the metal ion in the metal-containing compound to base metal.

In particular, if the photoactive layer of seeding solution is composed of Fe(III) and Pd(II) complexes, then the UV radiation causes the photo reduction of the Fe(III) complex and the subsequent catalytic reduction of the Pd(II) complex as follows:

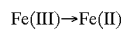

$Fe(III) \rightarrow Fe(II)$

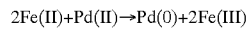

$2Fe(II) + Pd(II) \rightarrow Pd(0) + 2Fe(III)$

The Pd(0) seed is deposited onto the three-dimensional substrate by simple adsorption.

In the third step of the process, having photoselectively formed a patterned seeding layer on the three-dimensional substrate surface of interest, the unexposed regions of the photoactive layer of seeding solution, which still contact and surround the patterned seeding layer; are now removed for the reasons discussed above. This is achieved, in accordance with the invention, by immersing the substrate in an alkaline solution, such as an aqueous sodium hydroxide solution. Significantly, the pH of this alkaline solution should be at least about 14, while the temperature of the alkaline solution should range from about 40 degrees C to about 55 degrees C. Temperatures and pHs less than about 40 degrees C and about 14, respectively, are undesirable because the corresponding solutions do not serve to remove all of the unexposed regions of a seeding solution and they yield undesirably small amounts of, for example, oxidized iron gel.

Temperatures greater than about 55 degrees C are undesirable because the corresponding solutions serve to remove both the exposed and unexposed regions of a seeding solution.

By way of example, a useful alkaline solution is one which is an aqueous sodium hydroxide solution, in which the concentration of sodium hydroxide is, for example, 2M and the temperature of the solution is 55 degrees C.

It should be noted that in the case of polyimide substrates, the above-described alkaline solution need not be heated to temperatures above room temperature (about 25 degrees C). That is, the surfaces of polyimide substrates tend to be so smooth that the unexposed regions of the corresponding photoactive layers of seeding solution are readily removed by using alkaline solutions maintained at room temperature.

As noted above, using, an alkaline solution to remove the unexposed regions of a layer of seeding solution has the unexpected, advantageous result of also forming a gel of an oxidized species of iron or ruthenium, e.g., iron oxyhydroxide or ruthenium oxyhydroxide, around the seed metal. This gel is advantageous because it prevents oxidation of the seed metal, and thus permits the corresponding substrate to be stored for months before immersion in a metal plating bath. Moreover, upon immersion in a metal plating bath, the gel expands and becomes very permeable in such a bath to permit deposition of metal onto the seed metal. (It should be noted that the amount of gel, in relation to the amount of plated metal and seed metal, is extremely small and has no discernable effect on the utility of the plated metal.) By contrast, if an acidic solution were to be used to remove the unexposed regions of a photoactive layer of seeding solution, then it has been found that such a removal process necessarily results in the oxidation of the seed metal. This is highly disadvantageous because essentially no metal will be deposited onto the oxidized seed metal when the corresponding substrate is immersed in a metal plating bath. Further, such an acidic solution removes both the exposed and the unexposed regions of the photoactive layer of seeding solution.

With the removal of the unexposed regions of the layer of seeding solution, as described above, the substrate is now ready for deposition of metal onto the seed metal via, for example, electroless metal plating. Metallization is the fourth step in the process. In this regard, if the seed metal consists of palladium (Pd), platinum (Pt), gold (Au) or silver (Ag), then it should be noted that a variety of metals are readily deposited onto these seed metals. Included among this variety are copper (Cu), cobalt (Co), nickel (Ni) and gold (Au).

As is known, conventional industrial metal plating baths, e.g., conventional industrial electroless copper plating baths, operate at relatively high temperatures, such as, for example, 72 degrees C. This is disadvantageous because direct immersion of a substrate bearing a patterned seeding layer into such an industrial metal plating bath will result in the partial or total destruction of the patterned seeding layer. To avoid such destruction, and in accordance with the invention, a substrate bearing a patterned seeding layer is first immersed in a corresponding metal plating bath operating at room temperature (about 25 degrees C). The purpose of such an immersion is to deposit a relatively thin layer of metal, hereinafter referred to as a strike layer, onto the seeding layer, which serves to protect the seeding layer when the substrate is immersed in an industrial metal plating bath. It should be noted that the thickness of such a strike layer should be at least one (1) micrometer to achieve effective protection of the seeding layer.

With the formation of the strike layer on the patterned seeding layer, the substrate can now be immersed in an industrial metal plating bath to deposit additional metal onto the strike layer.

As noted above, the invention is useful for selectively metallizing a variety of three-dimensional substrates, such as polyimide substrates, printed circuit board substrates and ceramic substrates, particularly the cone structures used to connect layers in a multi-layer circuit board. Included among the polyimide substrates are those having compositions which include biphenyl tetracarboxylic dianhydride-phenylene diamine (BPDA-PDA), biphenyl tetracarboxylic dianhydride-oxydianiline (BPDA-ODA) and members of the Kapton polyimide family, such as Kapton E polymide which has PMDA, ODA, BPDA and an additional component. Also included among the polyimide substrates are those having compositions which include pyromellitic dianhydrideoxydianiline (PMDA-ODA). Significantly, in connection with each of these polyimide substrates, it has been found that the adhesion of metal, e.g., copper, deposited onto a patterned seeding layer overlying the surface of a polyimide substrate is substantially increased if the surface is base hydrolyzed before the layer of seeding solution is formed on the polyimide surface. This is readily achieved by immersing the substrate surface into, for example, an aqueous solution of sodium hydroxide and N,N,N',N'-tetrakis (2-hydroxypropyl) ethylenediamine for, for example, 10 to 30 minutes. The concentration of the former preferably ranges from about 2M to about 2.5M, while the concentration of the latter preferably ranges from about 0.05M to about 0.1M. However, while the base hydrolysis of a polyimide substrate enhances metal adhesion, such hydrolysis is undesirable because the polyimide is converted to the disodium salt of the corresponding polyamic acid.

Also in connection with the above-mentioned polyimides, there is a distinction between those having compositions which include BPDA-PDA and BPDA-ODA, and those having compositions which include PMDA-ODA. That is, the former are resistant to attack by hot alkaline baths, i.e., alkaline baths heated to temperatures above room temperature (about 25 degrees C), whereas the latter are not resistant to such attack. (Of course at sufficiently high temperatures, e.g., at a temperature of 150 degrees C, and/or sufficiently high pH, e.g., a pH of 14, even BPDA-PDA and BPDA-ODA are subject to attack.) Consequently, when the former are immersed in industrial metal plating baths, which are typically alkaline, no adverse consequences follow. However, when the latter are immersed in hot industrial metal plating baths, the areas of the substrates which are not covered by patterned seeding layers may be attacked and thereby converted to the corresponding polyamic acids.

Fortunately, the conversion of polyimide to polyamic acid, resulting from the above-described base hydrolysis process and metal plating process, is, readily reversible. That is, in all cases, after plating, the polyimide substrates are readily heated so as to convert any polyamic acids to the corresponding polyimides, using the same procedures and temperatures conventionally used to convert polyamic acids to the corresponding polyimides. Thus, any damage suffered during base hydrolysis and metal plating is easily repairable.

Included among the printed circuit board substrates which are readily selectively metallized via the invention are those which have epoxy resin/fiberglass compositions. In addition, the invention is also useful in connection with printed circuit board substrates having compositions which include fluoropolymers. These include substrates with compositions which include:(1)polytetrafluoroethylene (PTFE); (2)

copolymers of tetrafluoroethylene and hexafluoropropylene; (3) copolymers of tetrafluoroethylene and perfluoroalkoxyvinyl ether; and (4) copolymers of PTFE and compounds having one or more fluorinated dioxole ring segments. In connection with (4), it should be noted that such substrates often have amorphous structures.

In connection with printed circuit board substrates having compositions which include PTFE and which have undergone densification, it has been found that the surfaces of such substrates often contain undesirable chromium deposits. Such deposits are undesirable because the chromium acts like seed metal, causing metal, e.g., copper, to be plated where no such plating is desired. Significantly, it has been found that such chromium deposits are readily removed, prior to the formation of a photoactive layer of seeding solution, by immersing the substrate in an aqueous, sodium persulfate/sulfuric acid solution. One such useful solution is formed by dissolving 25 grams of sodium persulfate and 5 milliliters of sulfuric acid in 100 milliliters of deionized water. The corresponding immersion time should be about 2 minutes.

Included among the ceramic substrates which are readily selectively metallized via the invention are those having alumina compositions, aluminum nitride compositions and silicon nitride compositions.

EXAMPLE 1

An epoxy resin/fiberglass (commonly referred to in the trade as FR-4) printed circuit board substrate was immersed for 30 seconds in a bath of alkaline cleaner/degreaser sold under the trade name K2 by the Pennwalt Corporation of Cornweld Heights, Pa. This substrate was then rinsed with deionized water for 2 minutes, immersed for 10 seconds in a 10% sulfuric acid bath to neutralize the alkalinity of the K2 bath, and again rinsed with deionized water for 2 minutes.

A bath of palladium seeding solution was prepared by initially pouring 100 mL of water into a bath container and then adding 2 drops of Triton X-100 surfactant to the bath. Thereafter, 4.7 grams of potassium trioxalatoferrate hydrate was added to the bath, while stirring, until the potassium trioxalatoferrate hydrate was completely dissolved. Finally, 0.7 grams of tetraamine palladium chloride monohydrate was added to the bath, while stirring, until the tetraamine palladium chloride monohydrate was complete dissolved.

The epoxy resin/fiberglass substrate was immersed in the above-described palladium seeding solution bath for 5 minutes. During this immersion, the bath was continuously filtered through a 5 micrometer filter cartridge. Upon removal from this bath, the substrate was air-dried with a so-called air knife.

The substrate was exposed to UV light, through a mask, using a Tamarak Model 161B lamp to achieve photoselective seeding. The intensity of the UV light which impinged upon the substrate was 62 mJ/cm(sup 2). The exposure time was 10 seconds.

After the photoselective seeding step, the unexposed regions of the layer of seeding solution on the substrate were removed by immersing the substrate for 2 minutes in a 2M sodium hydroxide bath, maintained at 50–55 degrees C.

Upon removal from the sodium hydroxide bath, the substrate was rinsed with deionized water for 2 minutes, immersed in 10% sulfuric acid for 10 seconds, and then once again rinsed with deionized water for 1 minute.

The substrate was immersed in a conventional, electroless copper plating bath, maintained at a room temperature (about 25 degrees C), for 15 minutes. As a result, a strike layer of copper, having a thickness of 10 micrometers, was formed on the patterned palladium seeding layer. Thereafter, the substrate was immersed in a conventional, industrial electroless copper plating bath.

Optical inspection of the substrate under a microscope showed that copper had deposited only onto the patterned palladium seeding layer, and nowhere else. The copper adhesion was very good.

EXAMPLE 2

A polytetrafluoroethylene (PTFE, Model 2800 printed circuit board substrate, purchased from the Rogers Corporation of Rogers, Conn., was initially densified using a copper foil which contained a chromium oxide. This substrate was then treated with a conventional HCl solution to remove the copper foil. Thereafter, the substrate was initially cleaned with an aqueous, sodium persulfate/sulfuric acid solution, described above, for 2 minutes, to remove chromium deposits. Finally, with the exception of the immersion in the K2 cleaner, this substrate was subjected to the same processing steps as those described in Example 1. The results were the same as those achieved in Example 1.

EXAMPLE 3

A PMDA-ODA polyimide film, sold under the trade name Kapton by the DuPont company, was initially base hydrolyzed by being immersed, for 10 minutes, in the above-described alkaline solution containing sodium hydroxide and N,N,N',N'-tetrakis (2-hydroxypropyl) ethylenediamine. A layer of seeding solution was then formed on the modified polyimide film by immersing the film for 10 minutes, in a solution containing potassium trioxalatoferrate and tetraamine palladium chloride.

A patterned palladium seeding layer was formed on the polyimide film by exposing the film to UV light through a mask. The unexposed regions of the layer of seeding solution were removed by immersing the film in an aqueous, 2M, sodium hydroxide solution maintained at room temperature.

The polyimide film was immersed in an electroless copper plating bath, operated at room temperature, for no more than 10 minutes to form a strike layer of copper on the patterned palladium seeding layer. The polyimide film was then immersed in a hot, industrial electroless copper plating bath in order to deposit additional copper onto the strike layer. Thereafter, the polyimide film was heated to 300 degrees C to imidize any polyamic acid which may have formed during the initial base hydrolysis and subsequent immersion in the industrial electroless copper plating bath.

Optical inspection of the polyimide film under a microscope showed that copper had deposited only onto the patterned palladium seeding layer, and nowhere else. The copper adhesion was very good.

EXAMPLE 4

A thin film of BPDA-PDA was spin coated onto a silicon wafer and heated to drive off the casting solvent and to cure the film to the polyimide structure. This film was base hydrolyzed by immersing the film, for 10 minutes, in the above-described alkaline solution containing hydroxide. and N,N,N',N'-tetrakis (2-hydroxypropyl) ethylenediamine. A layer of seeding solution was then formed on the polyimide film by immersing the film, for 30 minutes, in a solution containing potassium trioxalatoferrate and tetraamine palladium chloride.

A patterned palladium seeding layer was formed on the polyimide film by exposing the layer of seeding solution to UV light through a mask. The unexposed regions of the layer of seeding solution were removed by immersing the film in an aqueous, 2M, sodium hydroxide solution maintained at room temperature.

The polyimide film was immersed in an electroless copper plating bath, operated at room temperature, in order to form a strike layer of copper on the patterned palladium seeding layer. Thereafter, the polyimide film was immersed in an industrial electroless copper plating bath in order to deposit additional copper onto the strike layer. Thereafter, the polyimide film was heated to 300 degrees C to imidize any polyamic acid which may have formed during the initial base hydrolysis. The results were the same as those achieved in Example 3.

EXAMPLE 5

A fifth example particularly points out the application of the present invention to three-dimensional surfaces such as the cones used as connectors between layers of a multi-layer printed circuit board. In example 5, an epoxy glass substrate is cleaned in dilute HCl and laminated with 8130 Vacrel on a hot roll laminator. The Vacrel is exposed using a photolithographic mask to reveal pads with approximate dimensions 0.03×0.03 inches. The sample is then developed to remove unexposed Vacrel. The pads are then laser ablated to obtain 3 mil high cones on a micro thin layer of Vacrel. The sample can then be cured by a UV cure at 5 J/cm² and baking at 150 degrees C for 1 hour. Once the sample has been cured, the cones and other exposed Vacrel surfaces (i.e., pads) are micro-etched in a 55–60 degree C NaOH solution (pH= 12–13). The samples are rinsed in distilled water and placed in Reten 610 for several minutes to aid in the adsorption of seed. The samples are rinsed and placed in a room temperature solution containing potassium trioxalatoferrate(III) ($K_3Fe(C_2O_4)_3$) and tetraammine palladium(II) chloride monohydrate ($Pd(NH_3)_4Cl_2H_2O$) in 2% Triton X-100. The samples are then allowed to air dry vertically without rinsing. Samples may also be spin-dried at a low to moderate spin speed, however, due to the fragility of the samples it was determined that air drying would work for this application. In addition, under manufacturing conditions for these parts, the cards containing the cones/pads would be on a roll type assembly which would make spin-drying very difficult, if not impossible. A sputter mask was used for a lithographic mask so as to avoid placing anything directly over the top of the cones. The samples are then exposed for 10 minutes on a OAI (Optical Associates) mercury lamp operating at 5.3 mW/cm². Samples to be metallized in the electroless copper baths are rinsed in distilled water for 5 minutes to remove excess metal cations. Those samples which went directly into a nickel bath without a prior "strike" layer of copper are rinsed in a dilute HCl solution. Selectivity is minimized due to the high activity of the electroless nickel bath if samples are placed directly into the bath without a prior acid rinse. This does not appear to affect the seed already exposed. The following baths were examined:

1) MacDermid Cu835 room temperature electroless copper;
2) Tartrate based room temperature electroless copper;
3) IBM Endicott electroless copper; and
4) Enplate high temperature electroless nickel.

Photographs were taken using a scanning electron microscope of a set of 3 mil high Vacrel cones that have been plated with a thin layer of nickel (approximately 0.1 mil). Coverage was smooth and even for approximately 95% of the cone. Further examination of the tip showed that there was nickel there, however, the coverage was not as thick on the tips of the cones. Stress tests have not been performed to determine if the tip exhibits enough strength to withstand the pressure of a connector. It must be noted, however, that there will be a layer of gold deposited after nickel plating has occurred in order to insure a low resistance connection (see FIG. 1). There is sufficient nickel on the tips to further metallize the cones.

FIG. 1 shows cones plated in accordance with the invention. In FIG. 1 an electronic circuit package 10 has cone connectors 12 surrounded by dielectric material 18. The cone connectors 12 are coated with a photoseed layer 14 and then plated with a layer 16 of nickel and a second metal layer 17 of gold.

Figure 2:
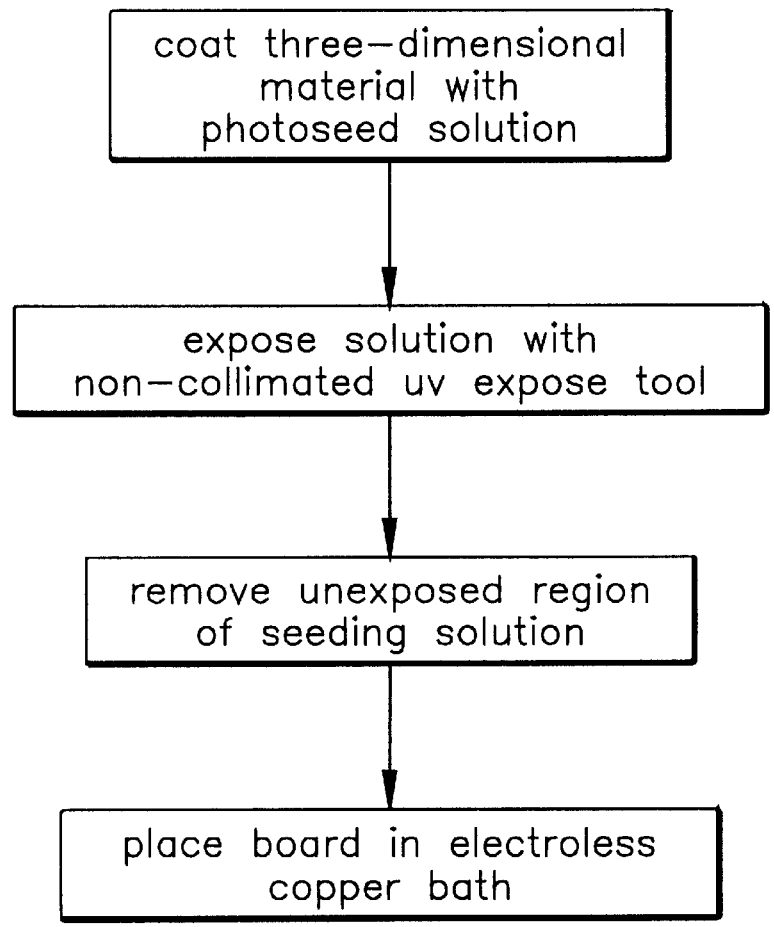
FIG. 2 summarizes the method of the invention.

FIG. 2 summarizes the method of seeding and metallization of three-dimensional materials by coating a board with cone connectors 12 with a layer 14 of photoseed solution, exposing layer 14 to light, removing the layer 14 from unexposed regions, and placing the board in an electrodes copper bath.

While the invention has been particularly shown and described with reference to preferred embodiments thereof, it will be understood by those skilled in the art that various changes in form and details may be made therein without departing from the spirit and scope of the invention.

We claim:

1. An electronic circuit package, comprising:
   a three-dimensional substrate comprising:
      a circuitized dielectric;
      one or more, selectively metallized three-dimensional cone-shaped projections disposed on the surface of the dielectric;
      the selective metallization formed by the process of:
         a. contacting a seed solution to a surface of the three-dimensional substrate, the seed solution comprising:
            (i) a first metal-containing compound with the general chemical formula $ML_mX_n$, where M denotes a seed metal cation, L is a Lewis base ligand, and X denotes an anion, m denotes an integer of value 1, 2, or 4 and n denotes an integer of value 1, 2, or 3; and
            (ii) a photoreactive oxalate compound with the general chemical formula $Y_3M((C_2O_4)_3)$ where Y denotes an alkali metal ion or a quaternary ammonium ion, and M denotes an iron ion or a ruthenium ion;
         b. exposing selected regions of the seed solution to light, to deposit seed metal from the seed solution onto the three-dimensional cone-shaped projections to form a patterned seeding layer;
         c. then contacting the seed solution on the substrate with alkaline solution to remove the seed solution;
         d. then electrolessly plating metal onto the patterned seeding layer.

2. The electronic circuit package of claim 1, wherein the dielectric is free of seed and the electrolessly plated metal.

3. The electronic circuit package of claim 1 wherein the three dimensional projections are connectors.

4. The electronic circuit package of claim 1, wherein the three dimensional substrate is a printed circuit board.

5. The electronic circuit package of claim 1, wherein the M in the $ML_mX_n$ is selected from the group consisting of: $Pd^{(2+)}$, $Pt^{(2+)}$, $Au^{(1+)}$, $Au^{(3+)}$, $Ag^{(1+)}$, and mixtures thereof.

6. A circuitized package comprising:
   a circuitized dielectric substrate;
   three dimensional cone-shaped structures, disposed on said substrate, comprising:

a polymeric base which is in contact with the dielectric substrate;

a layer of seed metal on the polymeric base;

a selectively electrolessly plated layer of metal disposed on the layer of seed metal;

wherein the three dimensional structures are electrically connected by electrical conductors to circuitry in the substrate.

7. The circuitized package of claim 6, wherein the dielectric is free of seed and the electrolessly plated metal.

8. The circuitized package of claim 6 wherein the three dimensional cone-shaped structure includes projections which are connectors.

9. The circuitized package of claim 6 wherein the substrate with the three dimensional cone-shaped structures is a printed circuit board.

10. The circuitized package of claim 6, wherein the layer of seed metal contains iron.

11. An intermediate structure for forming into an electronic circuit package, comprising:

a three-dimensional substrate comprising:
   a circuitized dielectric, one or more, three-dimensional cone-shaped projections disposed on the surface of said dielectric having seeded portions thereon suitable for subsequent metallization; said seeded portions of the surface formed by the process of
   a. contacting a seed solution to a surface of the three-dimensional substrate, the seed solution comprising:
      (i) a first metal-containing compound with the general chemical formula $ML_mX_n$, where M denotes a seed metal cation, L is a Lewis base ligand and X denotes an anion, m denotes an integer of value 1, 2, or 4 and n denotes an integer of value 1, 2, or 3; and
      (ii) a photoreactive oxalate compound with the general chemical formula $Y_3M((C_2O_4)_3)$ where Y denotes an alkali metal ion or a quaternary ammonium ion, and M denotes an iron ion or a ruthenium ion;
   b. exposing selected regions of the seed solution to light, to deposit seed metal from the seed solution onto the three-dimensional projections in a pattern corresponding the selected regions; and
   c. then contacting the seed solution on the substrate with an alkaline solution to remove the seed solution and form a gel of an oxidized species of iron or ruthenium on said seed metal.

12. A circuitized package comprising:

a circuitized, dielectric substrate;

three dimensional structures including cone-shaped projections, disposed on said substrate, comprising:
   a polymeric base which is in contact with the dielectric substrate;
   a layer of seed metal on the polymeric base;
   a layer of oxidized species of iron or ruthenium on said layer of seeded material.

13. The invention as defined in claim 12 wherein the layer of seed material contains iron.

* * * * *